United States Patent
Aridome

(10) Patent No.: US 7,200,499 B2
(45) Date of Patent: Apr. 3, 2007

(54) CALCULATION DEVICE CALCULATING AVAILABLE CAPACITY OF SECONDARY BATTERY AND METHOD OF CALCULATING THE SAME

(75) Inventor: Kouji Aridome, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/570,311

(22) PCT Filed: Oct. 6, 2004

(86) PCT No.: PCT/JP2004/015113

§ 371 (c)(1),
(2), (4) Date: Mar. 2, 2006

(87) PCT Pub. No.: WO2005/036192

PCT Pub. Date: Apr. 21, 2005

(65) Prior Publication Data

US 2006/0276981 A1 Dec. 7, 2006

(30) Foreign Application Priority Data

Oct. 10, 2003 (JP) ............................. 2003-351685

(51) Int. Cl.
*G01R 19/00* (2006.01)

(52) U.S. Cl. ...................................................... 702/64

(58) Field of Classification Search ................... 702/64
See application file for complete search history.

(56) References Cited

U.S. PATENT DOCUMENTS

| | | | |
|---|---|---|---|
| 5,422,822 A | 6/1995 | Toyota et al. | |
| 6,845,332 B2 | 1/2005 | Teruo | |
| 2004/0138836 A1* | 7/2004 | Ishishita et al. | 702/63 |
| 2005/0017725 A1* | 1/2005 | Murakami et al. | 324/426 |

FOREIGN PATENT DOCUMENTS

| | | |
|---|---|---|
| JP | A-06-006901 | 1/1994 |
| JP | A-2000-166109 | 6/2000 |
| JP | A-2003-149307 | 5/2003 |

* cited by examiner

*Primary Examiner*—John Barlow
*Assistant Examiner*—Cindy D. Khuu
(74) *Attorney, Agent, or Firm*—Oliff & Berridge, PLC

(57) ABSTRACT

A method of calculating an available capacity includes the steps of: calculating a first estimated SOC from a value in voltage; calculating an integral of a value of a current and adding the integral to calculate a second estimated SOC; calculating a difference between the first and second estimated SOCs; calculating a first correction coefficient R(1) from the value in voltage; calculating a second correction coefficient R(2) to be smaller for the current having a smaller value; and adding the second estimated SOC to an correction term, or the dSOC multiplied by R(1) and R(2), to calculate a corrected SOC.

12 Claims, 3 Drawing Sheets

F I G. 2
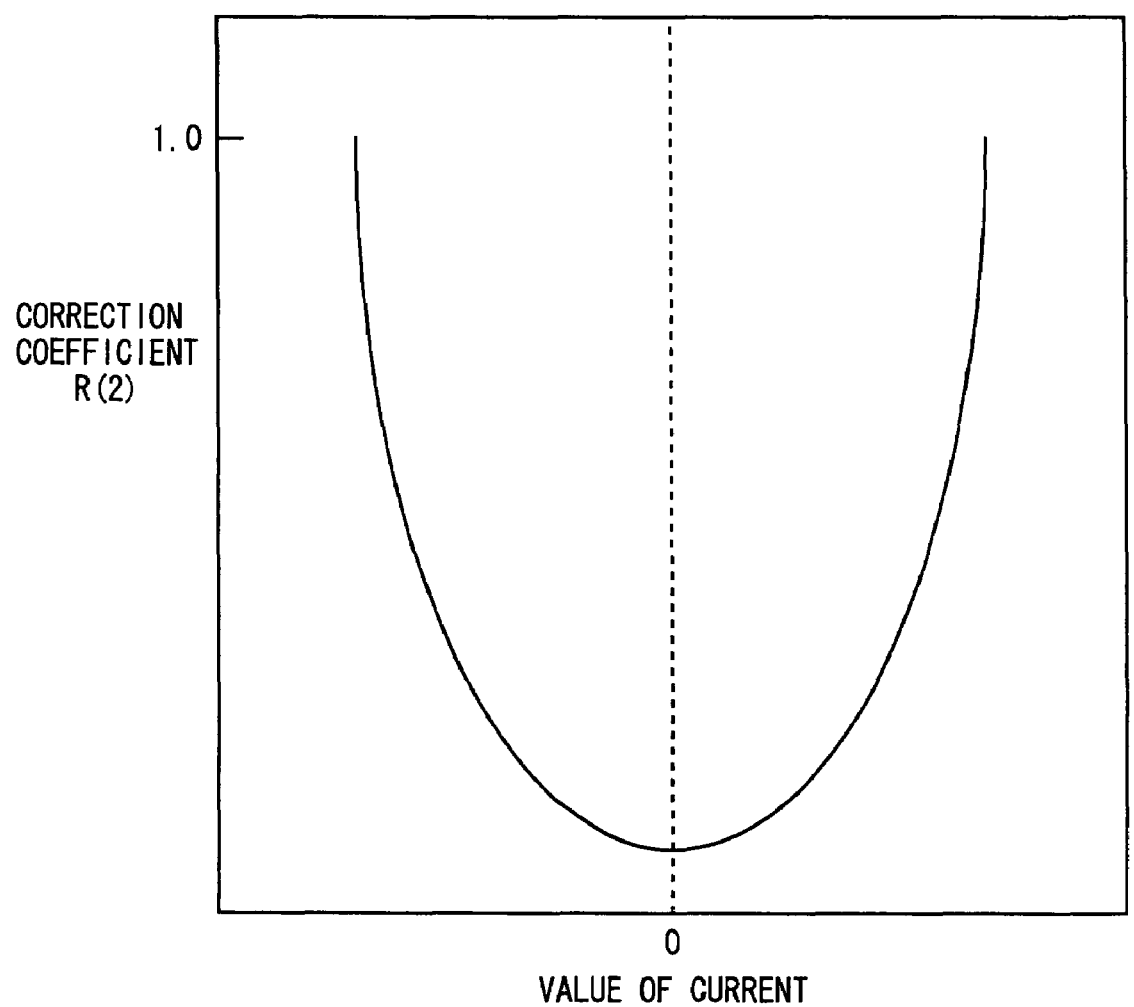

F I G. 3
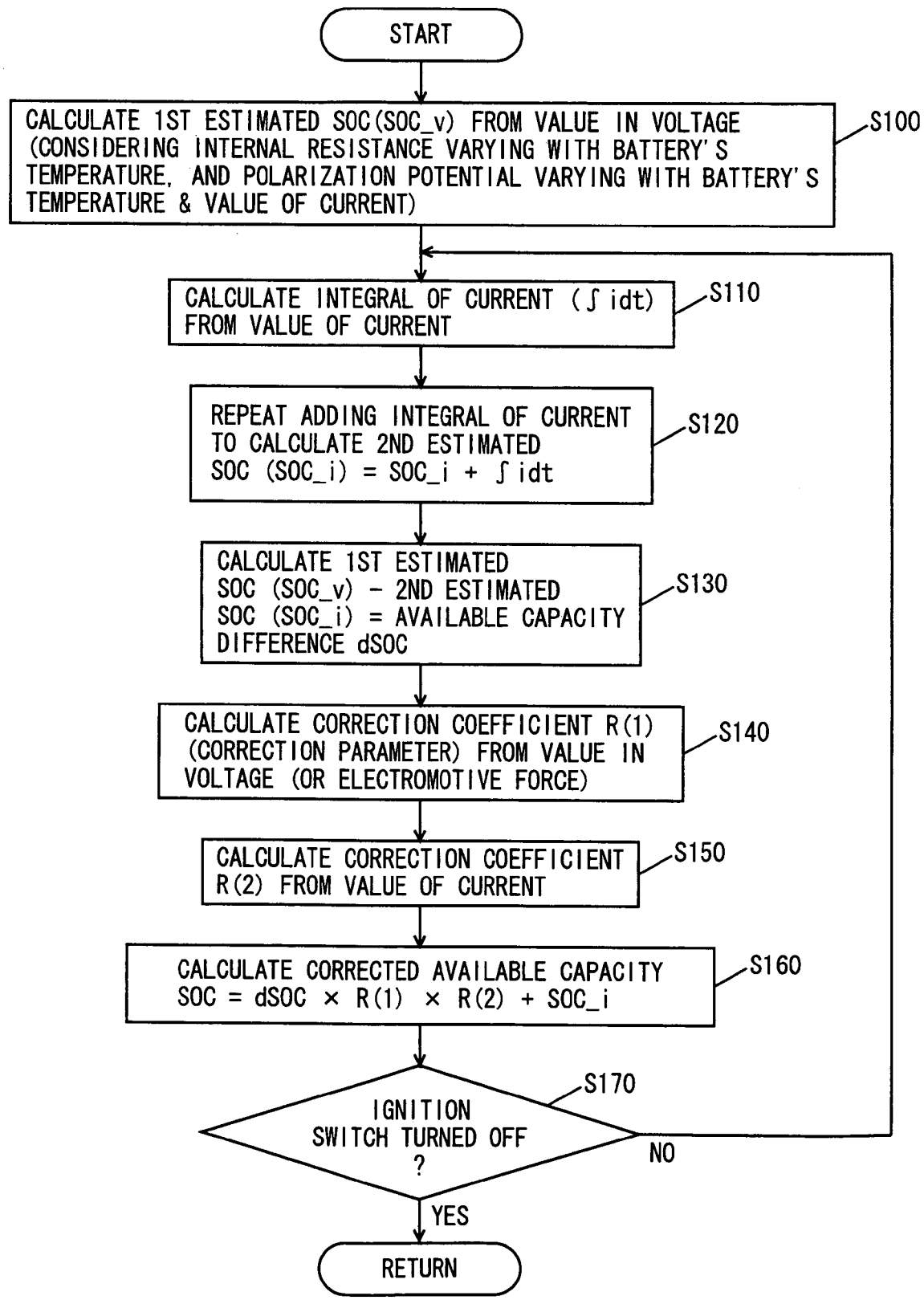

CALCULATION DEVICE CALCULATING AVAILABLE CAPACITY OF SECONDARY BATTERY AND METHOD OF CALCULATING THE SAME

TECHNICAL FIELD

The present invention relates generally to technology employed to detect a state of secondary batteries and particularly to technology employed to accurately calculate available capacity of secondary batteries.

BACKGROUND ART

Electric automobiles, hybrid automobiles and fuel cell vehicles employing a motor to obtain a force driving them have a secondary battery mounted therein. An electric automobile employs electrical power stored in the secondary battery to drive the motor to drive the vehicle. A hybrid automobile employs electrical power stored in the secondary battery to drive the motor to drive the vehicle or allows the motor to assist the engine to drive the vehicle. A fuel cell vehicle employs electrical power provided by a fuel cell to drive the motor to drive the vehicle, and employs electrical power provided by the fuel cell and in addition thereto that stored in the secondary battery to drive the motor to drive the vehicle.

Such vehicles have a regenerative braking function. More specifically, when the vehicle is braked, the motor is functioned as a power generator to convert the vehicle's kinetic energy to electrical energy to brake the vehicle. The obtained electrical energy is stored to the secondary battery and reused for example in accelerating the vehicle.

Excessively discharging and charging the secondary battery impairs its performance as a battery. Accordingly, the secondary battery's state of charge (SOC), also referred to as "available capacity," must be considered in controlling charging/discharging the secondary battery. In particular, a hybrid automobile of a type of a vehicle that has a heat engine mounted therein and uses the heat engine to drive a power generator to generate power which is in turn stored in a secondary battery, is often controlled to allow the secondary battery to have an SOC between a fully charged state (or 100%) and a completely uncharged state (or 0%), i.e., around 50 to 60%, to allow the secondary battery to accept regenerated power and also supply power to the motor upon receiving a request to do so. Accordingly, the secondary battery's available capacity (or SOC) must be detected more accurately.

One such method of detecting a secondary battery's available capacity is a method of doing so as based on the voltage appearing at a terminal of the secondary battery, i.e., open circuit voltage, electromotive force. Furthermore, as the terminal's voltage varies with a current's value, there is also a method employing a current sensor to measure a value of a current charging/discharging a secondary battery, and obtaining an integral of the value to estimate available capacity.

Japanese Patent Laying-Open No. 2003-149307 discloses a method of calculating an available capacity of a battery that can ensure high precision in estimating an SOC without depending on the battery's charging/discharging pattern. This method employs the battery's electromotive force and an integral of the value of a current to estimate the battery's available capacity (or SOC) and includes the steps of determining a correction parameter for the SOC by the battery's electromotive force and employing the correction parameter to correct an SOC obtained from the integral. The step of employing includes the steps of obtaining the electromotive force from the battery's voltage; obtaining a first estimated SOC from the electromotive force; obtaining a second estimated SOC from the integral; obtaining an amount for correction from a difference between the first and second estimated SOCs with the correction parameter; and employing the amount for correction to correct the second estimated SOC.

In accordance with this method the correction parameter is determined so that the battery's SOC obtained from the integral is corrected from the battery's electromotive force in an increased amount for an SOC range for which an SOC is estimated from the electromotive force with high precision and in a decreased amount for an SOC range for which an SOC is estimated from the electromotive force with low precision. Thus the SOC can be estimated with improved precision for all SOC ranges and there can be provided a method of calculating an available capacity of a battery with high precision without relying on its charging/discharging patterns.

As described in Japanese Patent Laying-Open No. 2003-149307, however, the correction parameter is determined by the electromotive force. More specifically, the correction parameter is determined to be large for a range for which an SOC would be estimated as based on the electromotive force with high precision, whereas it is determined to be small for a range for which an SOC would be estimated from the electromotive force with low precision. In such a method if the secondary battery is charged/discharged with a current having a small value and accordingly an SOC estimated from electromotive force is poor in precision, the correction parameter may nonetheless be determined to have a large value, which can result in an inaccurately calculated SOC.

DISCLOSURE OF THE INVENTION

The present invention has been made to overcome the above disadvantage and it contemplates a calculation device capable of accurately calculating an available capacity of a secondary battery and a method of calculating the same.

The present invention in one aspect provides a calculation device calculating an available capacity of a secondary battery, including: a voltage detector that detects a value in voltage of the secondary battery; a current detector that detects a value of a current of the secondary battery; and a calculator that calculates as based on the value in voltage of the secondary battery a first correction parameter employed in calculating an available capacity of the secondary battery, calculates as based on the value of the current of the secondary battery a second correction parameter employed in calculating the available capacity of the secondary battery, and uses the value in voltage, the value of the current and the first and second correction parameters to calculate the available capacity of the second secondary battery.

In accordance with the present invention in calculating a secondary battery's available capacity or SOC a second correction parameter can be calculated as based on a value of a current of the secondary battery. Conventionally a first correction parameter that is calculated as based on a value in voltage of the secondary battery has alone been used to calculate a corrected SOC. In contrast, the present calculation device can use not only the first correction parameter but also the second correction parameter to calculate a corrected SOC. If the battery is charged/discharged by a current having a small value and an SOC estimated as based on voltage (or open circuit voltage) is poor in precision, the second correction parameter can be calculated as based on the value of the current so that an correction term that the SOC estimated based on the voltage affects can contribute at a reduced degree. For example if correction term is used to calculate an accurate SOC from an estimated SOC calculated as based on an integral of the current, the term's contribution can be adjusted in degree depending on the magnitude of the value of the current charging/discharging the battery. As a result the present calculation device can accurately calculate the secondary battery's available capacity.

Preferably the calculator calculates as based on the value in voltage a first estimated available capacity from an open circuit voltage of the secondary battery, calculates as based on the value of the current a second estimated available capacity from an integral of a value of a current charging/discharging the secondary battery, and employs a function using a difference between the first and second estimated available capacities and the first and second correction parameters to correct to the second estimated available capacity to calculate the available capacity of the secondary battery.

In accordance with the present invention for example a correction term can be used to calculate an accurate SOC from a second estimated available capacity (SOC_i) calculated as based on an integral of a value of a current charging/discharging the battery. More specifically, from the secondary battery's open circuit voltage a first estimated available capacity (SOC_v) can be calculated. A function can be used that employs a difference between the first and second estimated available capacities (SOC_v and SOC_i) and first and second correction parameters (R(1) and R(2)). This function is adapted to be a function that multiplies the correction term by the second correction parameter (R(2)) calculated as based on the value of the current charging/discharging the battery and if the current has smaller values the second correction parameter (R(2)) can be reduced. This allows a reduced degree in contribution of the correction term affected by the first estimated available capacity (SOC_v) reduced in precision for the current having smaller values and the second estimated available capacity (SOC_i) can be corrected to calculate an accurate available capacity.

Still preferably the function is a function of the difference multiplied by the first and second correction parameters.

In accordance with the present invention a difference between the first and second estimated available capacities (SOC_V and SOC_i) can be multiplied by the first and second correction parameters (R(1) and R(2)) to calculate a correction term. As the second correction parameter (R(2)) is adapted to be reduced for smaller values of the current charging/discharging the battery, the correction term will be calculated to be smaller and can thus contribute at a reduced degree. In other words, the correction term affected by the first estimated available capacity (SOC_v) calculated as based on an open circuit voltage and poor in precision for the current having smaller values, can be smaller and thus contribute at a reduced degree.

Still preferably the calculator adds a correction calculated by the function to the second estimated available capacity to calculate the available capacity of the secondary battery.

In accordance with the present invention a correction, or the correction term, can be added to the second estimated available capacity (SOC_i) to calculate the secondary battery's available capacity. With reference to an available capacity calculated by an integral of a current, a correction can be made with a value in voltage and that of a current both considered to calculate an accurate available capacity.

Still preferably the second correction parameter is increased when the secondary battery is charged/discharged by a current larger in absolute value and the second correction parameter is decreased when the secondary battery is charged/discharged by a current smaller in absolute value.

In accordance with the present invention if the secondary battery is charged/discharged with a current smaller in absolute value the secondary correction parameter (R(2)) can be decreased so that the correction term affected by the first estimated available capacity (SOC_v) calculated from an open circuit voltage and poor in precision can contribute at a decreased degree. In contrast if the secondary battery is charged/discharged with a current larger in absolute value the secondary correction parameter (R(2)) can be increased so that the correction term affected by the first estimated available capacity (SOC_v) calculated from the-open circuit voltage and poor in precision can contribute at an increased degree.

The present invention in another aspect provides a method of calculating an available capacity of a secondary battery, including the steps of: detecting a value in voltage of the secondary battery; detecting a value of a current of the secondary battery; calculating as based on the value in voltage of the secondary battery a first correction parameter employed in calculating an available capacity of the secondary battery; calculating as based on the value of the current of the secondary battery a second correction parameter employed in calculating the available capacity of the secondary battery; and using the value in voltage, the value of the current and the first and second correction parameters to calculate the available capacity of the second secondary battery.

BRIEF DESCRIPTION OF THE DRAWINGS

FIG. 2 is a graph of a correction coefficient R stored in the present battery ECU at a memory versus a current value.

FIG. 3 is a flow chart representing a structure of a program executed by the present battery ECU for control.

BEST MODE FOR CARRYING OUT THE INVENTION

Figure 1:
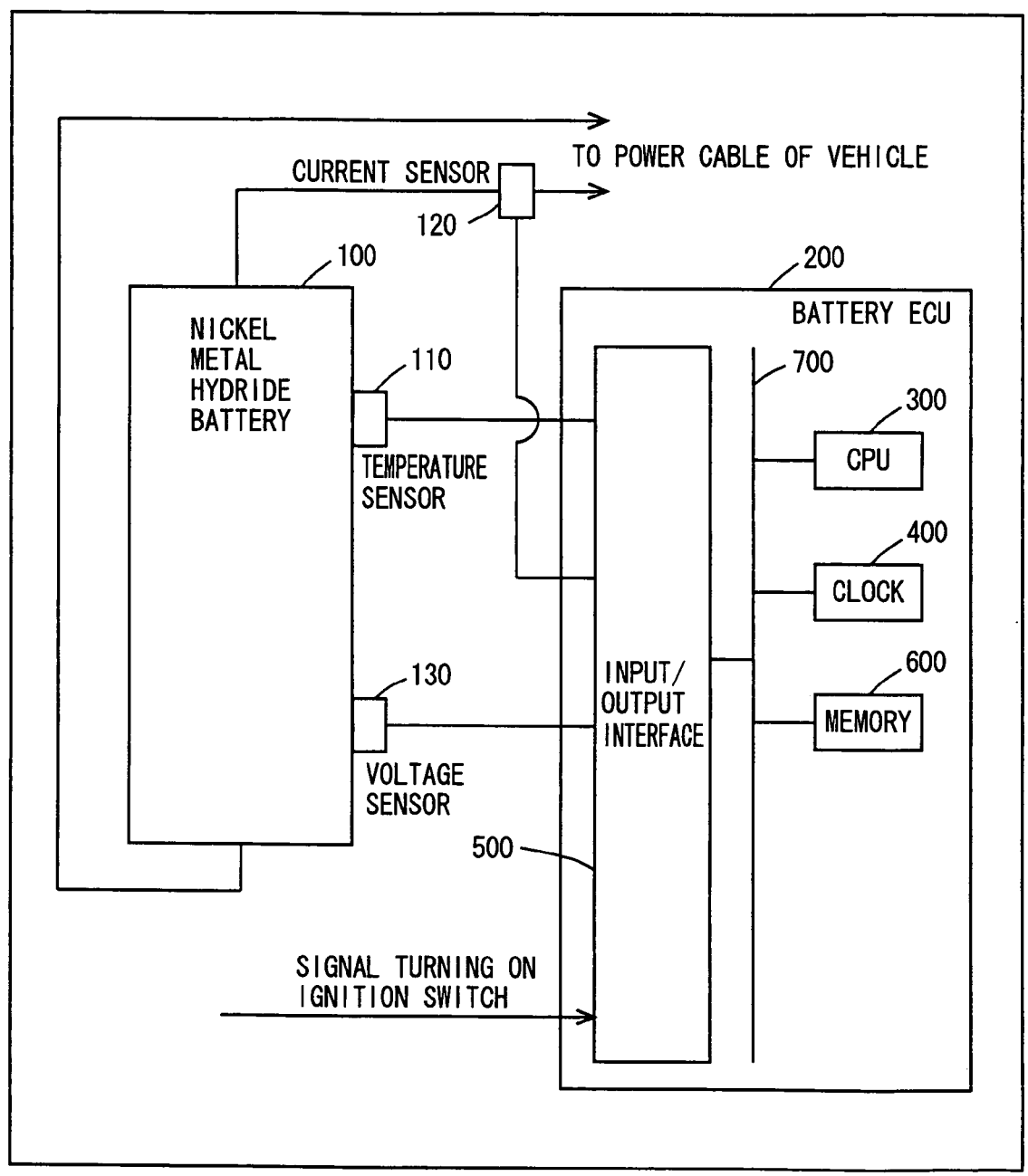
FIG. 1 is a block diagram for illustrating how a vehicle having a battery ECU mounted in accordance with an embodiment of the present invention is controlled.

Hereinafter reference will be made to the drawings to describe the present invention in embodiment. In the following description, identical components are identically denoted. They are also identical in name and function.

In the following will be described a calculation device that calculates an available capacity (or SOC) of a secondary battery (e.g., a nickel metal hydride battery) supplying a vehicle's driving equipment, accessory, electrical equipment and the like with power and receiving power supplied from a motor generator when the vehicle is regeneratively braked. While the secondary battery is not particularly limited in type, the following description will provided with the secondary battery described as a nickel metal hydride battery. Furthermore, the present calculation device is applicable to any of electric, hybrid and fuel cell automobiles.

With reference to FIG. 1 will be described a power unit of a vehicle including a battery electronic control unit (ECU) 200 implementing the present calculation device. As shown in the figure, the power unit includes a nickel metal hydride battery 100 and battery ECU 200.

Nickel metal hydride battery 100 has attached thereto a temperature sensor 110 measuring nickel metal hydride battery 100 in temperature and a voltage sensor 130 measuring nickel metal hydride battery 100 in voltage. Nickel metal hydride battery 100 is connected to a power cable of the vehicle by an output cable or input cable having a current sensor 120 attached thereto to measure a value of a current charging/discharging the battery.

Battery ECU 200 includes an input/output interface 500 connected to temperature sensor 110, current sensor 120, voltage sensor 130 and a line transmitting a signal turning on an ignition switch, a central processing unit (CPU) 300 controlling battery ECU 200, a clock 400, and a memory 600 storing a variety of data. Nickel metal hydride battery 100 has a power supply terminal connected to the power cable to supply the vehicle's driving motor, accessory, electric equipment and the like with power.

Temperature sensor 110 measuring and thus detecting the temperature of nickel metal hydride battery 100 outputs a temperature signal which is in turn transmitted through input/output interface 500 to CPU 300.

Current sensor 120 detecting a value of a current charging nickel metal hydride battery 100 and that of a current discharging the battery detects a current value which is in turn transmitted through input/output interface 500 to CPU 300. CPU 300 can provide an integral of the value over time to calculate an SOC.

Voltage sensor 130 measuring nickel metal hydride battery 100 in voltage detects a voltage which is in turn transmitted through input/output interface 500 to CPU 300. CPU 300 can calculate an SOC under a predetermined condition in accordance with open circuit voltage (OCV).

Internal to battery ECU 200 input/output interface 500, CPU 300, clock 400 and memory 600 are interconnected by an internal bus 700 to be capable of communicating data. Memory 600 has stored therein a program executed by CPU 300, a threshold value, a correction coefficient, a map and the like employed in the program, and the like.

With reference to FIG. 2, the present calculation device or battery ECU 200 at memory 600 stores a correction coefficient R(2) as described hereinafter. Correction coefficient R(2) is calculated as based on a value of a current of nickel metal hydride battery 100. Between correction coefficient R(2) and a value of a current charging/discharging the battery there is a relationship as shown in FIG. 2. Correction coefficient R(2) is a correction coefficient for an SOC that is determined as based on the value of the current charging/discharging nickel metal hydride battery 100. In contrast, a correction coefficient R(1) is a correction coefficient for an SOC that is calculated as based on electromotive force, as described in Japanese Patent Laying-Open No. 2003-149307.

As shown in FIG. 2, correction coefficient R(2) is a function of a value of a current charging/discharging nickel metal hydride battery 100. It provides a parabola approaching one for larger absolute values of the current. Note that such function is merely one example and is not limited to a function in the form of a parabola. It may be any function approaching one for larger absolute values of the current and approaching a value close to zero (e.g., approximately 0.1 to 0.2) for smaller absolute values of the current, i.e., a function protruding downward. Rather than a function, numerical data may be stored in memory 600.

With reference to FIG. 3 will be described a structure of a program executed in the present calculation device or battery ECU 200 by CPU 300 for control.

At step (S) 100 CPU 300 calculates a first estimated SOC (SOC_v) from a value in voltage. This value in voltage is detected as based on a signal received from voltage sensor 130 via input/output interface 500 to battery ECU 200. To the value in voltage measured, as detected by voltage sensor 130, a value of a drop in voltage attributed to internal resistance of nickel metal hydride battery 100 calculated by multiplying a value in internal resistance of nickel metal hydride battery 100 by a value of a current detected by current sensor 120, and a value in voltage attributed to a polarization phenomenon of nickel metal hydride battery 100 are added to calculate open circuit voltage (or electromotive force (OCV)). More specifically, to the value in voltage as measured, a value in voltage provided as voltage drops due to internal resistance, and a value in voltage attributed to polarization are added to calculate the open circuit voltage. Nickel metal hydride battery 100 provides the open circuit voltage in a generally known relationship with SOC, and from the open circuit voltage the first estimated SOC (SOV_v) can be calculated.

Furthermore, the value in internal resistance of nickel metal hydride battery 100 varies with the temperature thereof Accordingly the variation is considered in calculating the internal resistance for example from a map to calculate a drop in voltage attributed to the internal resistance. Furthermore, polarization potential varies with the temperature of nickel metal hydride battery 100 and the value of the current charging/discharging the battery. Accordingly the variation is considered in calculating a value in polarization potential for example from a map having the battery's temperature and the value of the current charging/discharging the battery as parameters.

At S110 CPU 300 calculates an integral of the current ($\int$ idt) from the value of the current. The integral is that of a current charging/discharging the battery for only a short period of time (dt). The value of the current is detected as based on a signal received from current sensor 120 through input/output interface 500 to battery ECU 200. Furthermore, the period of time for the integration is preferably only a short period of time for hybrid vehicles since when they are running they can repeatedly switch between charging and discharging with only a short period of time posed therebetween.

At S120 CPU 300 repeats adding such integral to calculate a second estimated SOC (SOC_i)=SOC_i+$\int$ idt.

At S130 CPU 300 calculates an available capacity difference d SOC between the first estimated SOC (SOC_v) calculated at S100 and the second estimated SOC (SOC_i) calculated at S120. More specifically, difference dSOC is calculated by SOC_v−SOC_i.

At S140 CPU 300 calculates correction coefficient R(1) from the value in voltage (or electromotive force). Correction coefficient R(1) is a correction parameter that is disclosed in Japanese Patent Laying-Open No. 2003-149307.

At S150 CPU 300 calculates correction coefficient R(2) from the value of the current, as based on a relationship between correction coefficient R(2) and a current charging/ discharging the battery, as shown in FIG. 2.

At S160 CPU 300 calculates a corrected available capacity SOC by dSOC×R(1)×R(2)+SOC_i.

At S170 CPU 300 determines whether the ignition switch is turned off. This decision is made by the fact that a signal that turns on the ignition switch is switched from on to off through input/output interface 500. When the ignition switch is turned off (YES at S 170) this process ends. Otherwise (NO at S 170) the process returns to S110, and the first and second estimated SOCs calculated from the open circuit voltage and the integral of the current, respectively, and correction coefficients R(1) and R(2) based on the value in voltage and that of the current, respectively, are employed to continue to calculate an SOC corrected. Note that when the ignition switch is turned off, the SOC calculated at S170 is stored to memory 600 as that provided at the end of the previous running.

In accordance with such a structure and flow chart as described above the power unit including the present battery ECU 200 operates, as described hereinafter.

When a driver rides in the vehicle and turns on the ignition switch, battery ECU 200 receives the temperature, value of a current and value in voltage of nickel metal hydride battery 100 from temperature sensor 110, current sensor 120 and voltage sensor 130, respectively. At a predetermined cycle time (as based for example on the operating frequency of CPU 300) the first estimated SOC (SOC_v) is calculated as based on the value in voltage as detected (S100) and from the detected value in voltage the second estimated SOC (SOC_i) is calculated (S120). A difference dSOC between the first and second estimated SOCs calculated (SOC_v and SOC_i) is calculated (S140).

As based on the value in voltage and that of the current, correction coefficients R(1) and R(2), respectively, are calculated (S150 and S160). Difference dSOC and correction coefficients R(1) and R(2) are used to calculate a corrected SOC (S160) by dSOC×R(1)×R(2)+SOC_i, i.e., (SOC_v−SOC_i)×R(1)×R(2)+SOC_i.

The SOC thus calculated will be described with specific numerical values (assumed values).

The assumed values are set as follows: the first estimated SOC (SOC_v) based on a value in voltage is set to be 50%; the second estimated SOC (SOC_i) based on a value of a current and obtain previously (or ten seconds earlier) is set to be 60%; and correction coefficient R(1) is set to be 0.1.

<For Current Having Large Value in the Present Invention>

For the current having a large value, a value of 100 [A] is assumed. More specifically, for ten seconds a current charging/discharging the battery has a value of 100 [A] for the sake of illustration. Correction coefficient R(2) is set to be one for the sake of illustration. In that case, the integral of the current (∫ idt) equals:

$$\frac{100\ [A] \times 10\ [sec]}{(6.5A \text{ for full charge} \times 3600\ [sec]) \times 100\ [\%]} = -4.27\ [\%]$$

$dSOC = SOC\_v - SOC\_i = 50 - (60 - 4.27) = -5.73\ [\%]$ $SOC = dSOC \times R(1) \times R(2) + SOC\_i$
$= -5.73 \times 0.1 \times 1 + (60 - 4.27)$
$= 55.16\ [\%]$ In other words, an SOC variation as calculated by the integral of the current is 4.27%, whereas that calculated with correction coefficients R(1) and R(2) is 4.84% (=60−55.16). This indicates that an SOC is calculated, corrected to be larger by 1.13 times.

<For Current Having Small Value in the Present Invention>

For the current having a large value, a value of 5 [A] is assumed. More specifically, for ten seconds a current charging/discharging the battery has a value of 5 [A] for the sake of illustration. Correction coefficient R(2) is set to be 0.2 for the sake of illustration. In that case, the integral of the current (∫ idt) equals:

$$\frac{5\ [A] \times 10\ [sec]}{(6.5A \text{ for full charge} \times 3600\ [sec]) \times 100\ [\%]} = -0.21\ [\%]$$

$dSOC = SOC\_v - SOC\_i = 50 - (60 - 0.21) = -9.79\ [\%]$ $SOC = dSOC \times R(1) \times R(2) + SOC\_i$
$= -9.79 \times 0.1 \times 0.2 + (60 - 0.21)$
$= 59.59\ [\%]$ In other words, an SOC variation as calculated by the integral of the current is 0.21%, whereas that calculated with correction coefficients R(1) and R(2) is 0.41% (=60−59.59). This indicates that an SOC is calculated, corrected to be larger by 1.95 times.

<Difference in Magnitude in Value of Current in the Present Invention>

Thus in the present invention whether the current charging/discharging the battery may have a large value or a small value a corrected SOC can be calculated. In contrast, Japanese Patent Laying-Open No. 2003-149307 describes how a corrected SOC is calculated, as follows:

<For Current Having Large Value in Japanese Patent Laying-Open No. 2003-149307>

As well as described above for a current having a large value, for a current having a large value a value of 100 [A] is assumed for the sake of illustration. More specifically, for ten seconds a current charging/discharging a battery has a value of 100 [A] for the sake of illustration. In that case, the integral of the current (∫ idt) equals:

$$\frac{100\ [A] \times 10\ [sec]}{(6.5A \text{ for full charge} \times 3600\ [sec]) \times 100\ [\%]} = -4.27\ [\%]$$

$dSOC = SOC\_v - SOC\_i = 50 - (60 - 4.27) = -5.73\ [\%]$ $SOC = dSOC \times R(1) \times R(2) + SOC\_i$
$= -5.73 \times 0.1 + (60 - 4.27)$
$= 55.16\ [\%]$ In other words, an SOC variation as calculated by the integral of the current is 4.27%, whereas that calculated with correction coefficients R(1) alone is 4.84% (=60−55.16). This indicates that an SOC is calculated, corrected to be larger by 1.13 times.

<For Current Having Small Value in Japanese Patent Laying-Open No. 2003-149307>

As well as described above for a current having a small value, for a current having a small value a value of 5 [A] is assumed for the sake of illustration. More specifically, for ten seconds a current charging/discharging a battery has a value of 5 [A] for the sake of illustration. In that case, the integral of the current (∫ idt) equals:

$$\frac{5\ [A] \times 10\ [sec]}{(6.5A \text{ for full charge} \times 3600\ [sec]) \times 100\ [\%]} = -0.21\ [\%]$$

$dSOC = SOC\_v - SOC\_i = 50 - (60 - 0.21) = -9.79\ [\%]$ $SOC = dSOC \times R(1) + SOC\_i$
$= -9.79 \times 0.1 + (60 - 0.21)$
$= 58.81[\%]$ In other words, an SOC variation as calculated by the integral of the current is 0.21%, whereas that calculated with correction coefficients R(1) alone is 1.19% (=60−58.81). This indicates that an SOC is calculated, corrected to be larger by as large as 5.67 times.

<Difference in Magnitude in Value of Current in Japanese Patent Laying-Open No. 2003-149307>

Thus, as described in Japanese Patent Laying-Open No. 2003-149307, whether the current charging/discharging the battery has a large value or a small value provides significantly different, corrected SOCs. In contrast, the present invention can eliminate such, as described above.

Thus the present calculation device can calculate an accurate SOC by correcting a second estimated SOC (SOC_i) calculated as based on an integral of a value of a current charging/discharging a battery. More specifically, from the secondary battery's open circuit voltage a first estimated SOC (SOC_v) can be calculated. A difference between the first and second estimated SOCs (or SOC_v and SOC_i) can be multiplied by first and second correction coefficients (R(1) and R(2)) to provide a correction term which can be added to the second estimated SOC (SOC_i) to calculate a corrected SOC. The second correction coefficient (R(2)) can be reduced for the current having smaller values. The correction term that is affected by the first estimated SOC (SOC_v) reduced in precision for a smaller value of the current charging/discharging the battery can less contribute, and the second estimated SOC (SOC_i) can be corrected to calculate an accurate available capacity.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A calculation device calculating an available capacity of a secondary battery, comprising:
   voltage detection means for detecting a value in voltage of said secondary battery;
   current detection means for detecting a value of a current of said secondary battery;
   means for calculating as based on said value in voltage of said secondary battery a first correction parameter employed in calculating an available capacity of said secondary battery;
   means for calculating as based on said value of said current of said secondary battery a second correction parameter employed in calculating said available capacity of said secondary battery; and
   calculation means using said value in voltage, said value of said current and said first and second correction parameters for calculating said available capacity of said secondary battery, wherein
   said second correction parameter is increased when said secondary battery is charged/discharged by a current larger in absolute value, and
   said second correction parameter is decreased when said secondary battery is charged/discharged by a current smaller in absolute value,
   wherein said calculation device prevents at least one excessive discharging and excessive charging of said secondary battery based on the calculated available capacity of said secondary battery.

2. The calculation device according to claim 1, wherein said calculation means includes:
   means for calculating as based on said value in voltage a first estimated available capacity from an open circuit voltage of said secondary battery;
   means for calculating as based on said value of said current a second estimated available capacity from an integral of a value of a current charging/discharging said secondary battery; and
   means employing a function using a difference between said first and second estimated available capacities and said first and second correction parameters to correct to said second estimated available capacity for calculating said available capacity of said secondary battery.

3. The calculation device according to claim 2, wherein said function is a function of said difference multiplied by said first and second correction parameters.

4. The calculation device according to claim 3, wherein said calculation means includes means adding a correction calculated by said function to said second estimated available capacity for calculating said available capacity of said secondary battery.

5. A method of calculating an available capacity of a secondary battery, comprising the steps of:
   detecting a value in voltage of said secondary battery;
   detecting a value of a current of said secondary battery;
   calculating as based on said value in voltage of said secondary battery a first correction parameter employed in calculating an available capacity of said secondary battery;
   calculating as based on said value of said current of said secondary battery a second correction parameter employed in calculating said available capacity of said secondary battery; and
   using said value in voltage, said value of said current and said first and second correction parameters to calculate said available capacity of said secondary battery, wherein
   said second correction parameter is increased when said secondary battery is charged/discharged by a current larger in absolute value, and
   said second correction parameter is decreased when said secondary battery is charged/discharged by a current smaller in absolute value,
   wherein said calculation device prevents at least one of excessive discharging and excessive charging of said secondary battery based on the calculated available capacity of said secondary battery.

6. The method according to claim 5, wherein the step of using includes the steps of:
   calculating as based on said value in voltage a first estimated available capacity from an open circuit voltage of said secondary battery;
   calculating as based on said value of said current a second estimated available capacity from an integral of a value of a current charging/discharging said secondary battery; and
   employing a function using a difference between said first and second estimated available capacities and said first and second correction parameters to correct to said second estimated available capacity to calculate said available capacity of said secondary battery.

7. The method according to claim 6, wherein said function is a function of said difference multiplied by said first and second correction parameters.

8. The method according to claim 7, wherein the step of employing includes the step of adding a correction calculated by said function to said second estimated available capacity to calculate said available capacity of said secondary battery.

9. A calculation device calculating an available capacity of a secondary battery, comprising:

a voltage sensor detecting a value in voltage of said secondary battery;

a current sensor detecting a value of a current of said secondary battery;

an electronic control unit: calculating as based on said value in voltage of said secondary battery a first correction parameter employed in calculating an available capacity of said secondary battery; calculating as based on said value of said current of said secondary battery a second correction parameter employed in calculating said available capacity of said secondary battery; and using said value in voltage, said value of said current and said first and second correction parameters to calculate said available capacity of said secondary battery, wherein said second correction parameter is increased when said secondary battery is charged/discharged by a current larger in absolute value, and said second correction parameter is decreased when said secondary battery is charged/discharged by a current smaller in absolute value.

10. The calculation device according to claim 9, wherein said electronic control unit calculates as based on said value in voltage a first estimated available capacity from an open circuit voltage of said secondary battery, calculates as based on said value of said current a second estimated available capacity from an integral of a value of a current charging/discharging said secondary battery, and employs a function using a difference between said first and second estimated available capacities and said first and second correction parameters to correct to said second estimated available capacity to calculate said available capacity of said secondary battery.

11. The calculation device according to claim 10, wherein said function is a function of said difference multiplied by said first and second correction parameters.

12. The calculation device according to claim 11, wherein said electronic control unit adds a correction calculated by said function to said second estimated available capacity to calculate said available capacity of said secondary battery.

* * * * *